US012598699B2

(12) United States Patent
Yang et al.

(10) Patent No.: US 12,598,699 B2
(45) Date of Patent: Apr. 7, 2026

(54) ULTRA-THIN COPPER FOIL WITH CARRIER FOIL FOR ALLOWING EASY MICRO-HOLE PROCESSING, COPPER-CLAD LAMINATE USING SAME, AND MANUFACTURING METHOD THEREFOR

(71) Applicant: Lotte Energy Materials Corporation, Jeollabuk-do (KR)

(72) Inventors: Chang Yol Yang, Jeollabuk-do (KR); Won Jin Beom, Jeollabuk-do (KR); Kideok Song, Jeollabuk-do (KR); Hyung Cheol Kim, Jeollabuk-do (KR)

(73) Assignee: LOTTE ENERGY MATERIALS CORPORATON, Jeollabuk-do (KR)

( * ) Notice: Subject to any disclaimer, the term of this patent is extended or adjusted under 35 U.S.C. 154(b) by 0 days.

(21) Appl. No.: 18/695,439

(22) PCT Filed: Jul. 12, 2022

(86) PCT No.: PCT/KR2022/010126
§ 371 (c)(1),
(2) Date: Mar. 26, 2024

(87) PCT Pub. No.: WO2023/054865
PCT Pub. Date: Apr. 6, 2023

(65) Prior Publication Data
US 2024/0407091 A1 Dec. 5, 2024

(30) Foreign Application Priority Data

Sep. 30, 2021 (KR) ........................ 10-2021-0130375

(51) Int. Cl.
*H05K 1/09* (2006.01)
*C25D 3/38* (2006.01)
*C25D 5/02* (2006.01)

(52) U.S. Cl.
CPC ................. *H05K 1/09* (2013.01); *C25D 3/38* (2013.01); *C25D 5/02* (2013.01)

(58) Field of Classification Search
CPC .. H05K 1/09; H05K 3/025; H05K 2201/0355; H05K 3/067; C25D 3/38;
(Continued)

(56) References Cited

U.S. PATENT DOCUMENTS

| 11,166,378 B2 | 11/2021 | Beom et al. |
| 2004/0038049 A1 | 2/2004 | Suzuki et al. |

(Continued)

FOREIGN PATENT DOCUMENTS

| CN | 1466517 A | 1/2004 |
| JP | 2003-200523 A | 7/2003 |

(Continued)

OTHER PUBLICATIONS

International Search Report from corresponding PCT Application No. PCT/KR2022/010126, dated Nov. 2, 2022.
(Continued)

*Primary Examiner* — Duy Vu N Deo
(74) *Attorney, Agent, or Firm* — Harness, Dickey & Pierce, P.L.C.

(57) ABSTRACT

Disclosed is an ultra thin copper foil with a carrier foil and a manufacturing method therefor, wherein the ultra-thin
(Continued)

copper foil with a carrier foil includes a carrier foil, a peeling layer, and an ultra-thin copper foil sequentially laminated, and the carrier foil includes a surface treatment layer on a face thereof facing the peeling layer.

8 Claims, 7 Drawing Sheets

(58) Field of Classification Search
CPC .......... C25D 5/02; C25D 1/04; C25D 7/0614; B32B 2250/05; B32B 2307/732; B32B 3/30; B32B 2307/748; B32B 2311/12; B32B 2457/08; B32B 15/08; B32B 15/20; B32B 7/06
USPC ......................................................... 216/105
See application file for complete search history.

(56) References Cited

U.S. PATENT DOCUMENTS

| | | | |
|---|---|---|---|
| 2004/0121178 A1 | 6/2004 | Suzuki et al. | |
| 2013/0247373 A1 | 9/2013 | Fujii et al. | |
| 2016/0242281 A1* | 8/2016 | Nagaura | H05K 1/0313 |
| 2017/0019991 A1* | 1/2017 | Miyamoto | H05K 3/4007 |
| 2021/0059057 A1 | 2/2021 | Ishii et al. | |
| 2021/0392749 A1 | 12/2021 | Su | |

FOREIGN PATENT DOCUMENTS

| | | | | | |
|---|---|---|---|---|---|
| JP | 2004-169181 A | | 6/2004 | | |
| JP | 2013-075443 A | | 4/2013 | | |
| JP | 2018168409 A | * | 11/2018 | | |
| JP | 2020-506296 A | | 2/2020 | | |
| KR | 10-1056691 B1 | | 8/2011 | | |
| KR | 10-2013-0082320 A | | 7/2013 | | |
| KR | 10-2014-0023744 A | | 2/2014 | | |
| KR | 10-1980993 B1 | | 5/2019 | | |
| KR | 10-2021-0090257 A | | 7/2021 | | |
| WO | WO-0205604 A1 | * | 1/2002 | | H05K 3/20 |
| WO | 2019/131000 A1 | | 7/2019 | | |

OTHER PUBLICATIONS

Office Action from corresponding Taiwanese Patent Application No. 111134554, dated Jun. 27, 2023.
Office Action from corresponding Japanese Patent Application No. 2024-519784, dated Jan. 15, 2025.
Search Report regarding European Patent Application No. 22876640.8, dated Sep. 11, 2025.

* cited by examiner 150
140
130
120
110
100

100B 100A 150
140
160
130
120
110
100

ULTRA-THIN COPPER FOIL WITH CARRIER FOIL FOR ALLOWING EASY MICRO-HOLE PROCESSING, COPPER-CLAD LAMINATE USING SAME, AND MANUFACTURING METHOD THEREFOR

CROSS-REFERENCE TO RELATED APPLICATIONS

This application is a national phase application of PCT Application No. PCT/KR2022/010126, filed on Jul. 12, 2022, which claims priority to Korean Patent Application No. 10-2021-0130375, filed on Sep. 30, 2021. The entire disclosures of the applications identified in this paragraph are incorporated herein by references.

TECHNICAL FIELD

The present disclosure relates to an ultra-thin copper foil with a carrier foil and a copper-clad laminate employing the same.

BACKGROUND ART

In an ultra-thin copper foil with a carrier foil, a peeling layer and an ultra-thin copper foil by copper electroplating are sequentially formed on one surface of a carrier foil, and the outermost surface of the ultra-thin copper foil formed of a copper plating is typically finished with a roughened surface.

A printed circuit board using an ultra-thin copper foil with a carrier foil may be manufactured as follows. First, the ultra-thin copper foil with a carrier foil is placed on a surface of an insulating substrate formed of a resin or the like such that an ultra-thin copper foil is disposed on the surface, followed by heating and pressing, thereby manufacturing a copper clad laminate. Then, plated through holes are formed in the manufactured laminate by sequentially conducting through-hole formation and through-hole plating, and then the copper foil present on the surface of the laminate is etched to form a wiring pattern having desired line widths and line pitches. Last, solder resist formation or other treatments are conducted.

Recently, a roughened surface of a copper foil is attached to an adhesive resin, such as an epoxy resin, in advance, and through the use of the adhesive resin as an insulating resin in a semi-cured state (B stage), the insulating resin layer is thermally pressed to an insulating substrate while the copper foil with the resin is used as a copper foil for surface circuit formation, thereby manufacturing a printed circuit board, especially, a build-up circuit board. Such a build-up circuit board requires a high degree of integration of various electronic components and correspondingly requires a high density of wiring patterns, and thus requires a printed circuit board with a wiring pattern formed of wirings of fine line widths or line pitches, that is, a fine pattern. For example, a high-density printed circuit board with a line width or line pitch of about 20 μm is required. For the formation of via holes in the build-up board, a laser via method using a CO2 gas laser is mainly used due to high productivity or the like. However, in a case where the CO2 gas laser is used in a conventional ultra-thin copper foil with a carrier foil, the CO2 gas laser could not directly perform via-hole processing since the surface of the copper foil reflected most of the light in an infrared region around 10,600 nm, which corresponds to the wavelength of the CO2 gas laser, and thus a conformal mask method was used by which via hole-forming portions of the copper foil were removed by etching in advance and then via-hole processing was performed on a substrate. However, the conformal mask method employs a complicated manner wherein an ultra-thin copper foil is etched in advance by not covering portions of the ultra-thin copper foil, where via holes are to be formed, with etching resist and covering the other portion with etching resist, and then via-hole processing is performed on the substrate (resin portion) by using CO2 gas laser. Therefore, via-hole processing can be simplified if it is possible to perform via-hole processing using CO2 gas laser on both the ultra-thin copper foil and the resin portion.

Hence, there has been required an ultra-thin copper foil with a carrier foil, which has a low reflectance of CO2 gas laser and thus allows via-hole processing for both an ultra-thin copper foil and a resin when through-hole or via-hole processing is performed on the ultra-thin copper foil with a carrier foil or a copper clad laminate including the same. For achieving this, Korean Patent Publication No. 2013-82320 discloses an ultra-thin copper foil with a carrier foil where a peeling layer is formed of a metal alloy layer containing particular contents of a first metal, a second metal facilitating plating of the first metal, and a third metal. However, even when via-hole processing is performed on such an ultra-thin copper foil by using CO2 laser, the surface of the copper foil still reflects a most part of laser light, resulting in a limit in efficient via-hole processing.

DISCLOSURE

Technical Problem

The present disclosure has been made to solve the above-mentioned problems, and an aspect of the present disclosure is to provide an ultra-thin copper foil with a carrier foil with a novel structure for allowing easy laser-hole processing and a manufacturing method therefor.

Another aspect of the present disclosure is to provide an ultra-thin copper foil with a carrier foil having excellent penetration processability for CO2 laser.

Still another aspect of the present disclosure is to provide a copper clad laminate including the above-described ultra-thin copper foil with a carrier foil.

Technical Solution

In accordance with an aspect of the present disclosure, there is provided an ultra-thin copper foil with a carrier foil, in which a carrier foil, a peeling layer, and an ultra-thin copper foil are sequentially laminated, wherein the carrier foil includes a surface treatment layer on a face thereof facing the peeling layer.

In the present disclosure, the surface treatment layer may have a surface structure in which protrusions with an average diameter of 10 μm or less are arranged. The surface treatment layer may have a surface structure in which protrusions with an average diameter of 2 μm or less are arranged.

In the present disclosure, the protrusions may have an area density of 8,000-10,000/mm$^2$.

In the present disclosure, the protrusions may be formed by etching a surface of the carrier foil.

In the present disclosure, a surface structure in which grooves with an average diameter of 10 μm or less may be arranged is formed on an S-surface of the ultra-thin copper foil after peeling.

In the present disclosure, a surface structure in which grooves with an average diameter of 2 μm or less are arranged may be formed on an S-surface of the ultra-thin copper foil after peeling.

The grooves of the surface structure may have a density of 8,000-10,000/mm².

In the present disclosure, the S-surface of the ultra-thin copper foil after peeling contains Ni and P.

The ultra-thin copper foil with a carrier foil may further include, between the peeling layer and the ultra-thin copper foil, a laser absorption layer containing Cu and containing at least one metal or alloy thereof selected from the group consisting of Ni, Co, Fe, Pb, and Sn.

The ultra-thin copper foil with a carrier foil of the present disclosure may further include an anti-diffusion layer between the carrier foil and the peeling layer. In addition, the ultra-thin copper foil with a carrier foil of the present disclosure may further include a heat-resistant layer between the peeling layer and the ultra-thin copper foil.

In accordance with another aspect of the present disclosure, there is provided a copper clad laminate formed by laminating the above-described ultra-thin copper foil with a carrier foil on a resin substrate.

In accordance with still another aspect of the present disclosure, there is provided a method for manufacturing an ultra-thin copper foil with a carrier foil by including forming a lamination structure of a carrier foil, a peeling layer, and an ultra-thin copper foil, wherein the forming of the lamination structure includes: providing the carrier foil; etching one surface of the carrier foil to form a surface treatment layer; and sequentially forming the peeling layer and the ultra-thin copper foil on the surface treatment layer.

In the present disclosure, an etching solution for the etching may be formed using at least one organic agent selected from the group consisting of sulfuric acid, hydrogen peroxide, a nitrogen-containing organic compound, and a sulfur-containing organic compound. In the present disclosure, 1,2,3-benzotriazole, carboxybenzotriazole, or the like may be used as the nitrogen-containing organic compound, and mercaptobenzothiazole, thiocyanuric acid, or the like may be used as the sulfur-containing organic compound.

Advantageous Effects

According to the present disclosure, an ultra-thin copper foil with a carrier foil with a novel structure for allowing easy laser-hole processing can be provided. Furthermore, the present disclosure can provide an ultra-thin copper foil with a carrier foil having precise and excellent penetration processability for CO2 laser and a copper clad laminate including the same.

BEST MODE

Configurations shown in exemplary embodiments and drawings described herein are merely the most preferred exemplary embodiments of the present disclosure and do not represent all of the technical ideas of the present disclosure, and thus it should be understood that various equivalents and variations that may replace these can be made. Hereinafter, exemplary embodiments of the present disclosure will be described in more detail with reference to the accompanying drawings.

As used herein, the term "lamination" refers to the bonding of at least two layers. For example, the lamination of a first layer and a second layer includes not only a direct contact of the first and second layers but also the bonding of an additional third layer interposed between the first and second layers. In a lamination structure of the present disclosure, the meaning that a third layer is present between a first layer and a second layer includes a case where the third layer is in direct contact with the first and second layers or a case where the third layer is not in direct contact with the first or second layer.

Figures 1A, 1B:
FIGS. 1A and 1B each schematically show a lamination structure of an ultra-thin copper film with a carrier film according to an embodiment of the present disclosure.

FIGS. 1A and 1B each schematically show a lamination structure of an ultra-thin copper film with a carrier film according to an embodiment of the present disclosure, respectively.

Referring to FIG. 1A, an ultra-thin copper film with a carrier film has a lamination structure in which a carrier foil 100, a surface treatment layer 110, an anti-diffusion layer 120, a peeling layer 130, a heat-resistant layer 140, and an ultra-thin copper foil 150 are sequentially laminated.

The carrier foil 100 serves as a support material (carrier) until the ultra-thin copper foil is bonded to an insulating substrate. An aluminum foil, a stainless steel foil, a titanium foil, a copper foil, or a copper alloy foil may be used as the carrier foil. For example, an electrolytic copper foil, an electrolytic copper alloy foil, a rolled copper foil, or a rolled copper alloy foil may be used. Preferably, the carrier foil may be an electrolytic copper foil, and an upper surface 100B of the carrier foil may be any one of a glossy surface or a matt surface. A lower surface 100A of the carrier foil may have a roughening treatment layer.

The carrier foil may have a thickness of 1 mm or less. For example, the thickness of the carrier foil may be 7 to 70 μm. For example, the thickness of the carrier foil may be 12 to 18 μm. The carrier foil, when having a thickness of less than 7 μm, may be difficult to serve as a carrier, and the carrier foil, when having a thickness of more than 1 mm, may not have a problem in serving as a carrier but during continuous plating for forming the peeling layer, ultra-thin copper foil, and the like, the tension of the carrier foil needs to be enhanced in a continuous plating line and a large-scale facility is needed.

In the present disclosure, the surface treatment layer 110 is added between the carrier foil 100 and the anti-diffusion layer 120 or at the boundary between the carrier foil 100 and the anti-diffusion layer 120. In the present disclosure, the surface treatment layer 110 may have a structure in which micro-protrusions with an average diameter of 10 μm or less, 5 μm or less, 2 μm or less, or 1 μm or less are arranged. In the present disclosure, the average diameter of the micro-protrusions is preferably 0.5 μm or more.

In the present disclosure, the area density of the micro-protrusions is preferably 8,000-10,000/mm$^2$.

As such, the surface treatment layer in the present disclosure has micro-protrusions equal to or smaller than the wavelength (e. g., 10,600 nm) of CO2 laser, and as described later, the micro-grooves, which are formed after peeling and correspond to the micro-protrusions, can promote the absorption of laser light by scattering laser light.

In spite of the surface treatment layer 100, the surface treatment layer 100 may be considered to be a low-roughness smooth surface, and the ultra-thin foil 150 sequentially formed thereon may also have a low-roughness surface. The surface treatment layer 100 in the present disclosure may have preferably a surface roughness of 0.5-1.5 μm.

Preferably, the surface treatment layer 110 may be formed by etching the surface of the carrier foil 100. For example, the surface treatment layer 110 may be formed by treatment with an etching solution containing sulfuric acid, hydrogen peroxide, sodium hydroxide, and at least one benzotriazole (BTA).

The anti-diffusion layer 120 and the heat-resistant layer 140 may contain at least one element selected from the group consisting of Ni, Co, Fe, Cr, Mo, W, Al, and P. For example, the anti-diffusion layer and the heat-resistant layer each may be a single metal layer, an alloy layer of two or more metals, or at least one metal oxide layer.

Examples of plating for forming a single metal layer may include nickel plating, cobalt plating, iron plating, aluminum plating, and the like. Examples of plating for forming a binary alloy layer may include nickel-cobalt plating, nickel-iron plating, nickel-chromium plating, nickel-molybdenum plating, nickel-tungsten plating, nickel-copper plating, nickel-phosphorus plating, cobalt-iron plating, cobalt-chromium plating, cobalt-molybdenum plating, cobalt-tungsten plating, cobalt-copper plating, cobalt-phosphorus plating, and the like. Examples of plating for forming a ternary alloy layer may include nickel-cobalt-iron plating, nickel-cobalt-chromium plating, nickel-cobalt-molybdenum plating, nickel-cobalt-tungsten plating, nickel-cobalt-copper plating, nickel-cobalt-phosphorus plating, nickel-iron-chromium plating, nickel-Iron-molybdenum plating, nickel-iron-tungsten plating, nickel-iron-copper plating, nickel-iron-phosphorus plating, nickel-chromium-molybdenum plating, nickel-chromium-tungsten plating, nickel-chromium-copper plating, nickel-chromium-phosphorus plating, nickel-molybdenum-tungsten plating, nickel-molybdenum-copper plating, nickel-molybdenum-phosphorus plating, nickel-tungsten-copper plating, nickel-tungsten-phosphorus plating, nickel-copper-phosphorus plating, cobalt-iron-chromium plating, cobalt-iron-molybdenum plating, cobalt-iron-tungsten plating, cobalt-iron-copper plating, cobalt-iron-phosphorus plating, cobalt-chromium-molybdenum plating, cobalt-chromium-tungsten plating, cobalt-chromium-copper plating, cobalt-chromium-phosphorus plating, cobalt-molybdenum-phosphorus plating, cobalt-tungsten-copper plating, cobalt-molybdenum-phosphorus plating, cobalt-tungsten-copper plating, cobalt-tungsten-phosphorus plating, cobalt-copper-phosphorus plating, and the like.

Preferably, the anti-diffusion layer 120 and the heat-resistant layer 140 may contain Ni and P.

The anti-diffusion layer 120 suppresses the diffusion of copper into the peeling layer when the ultra-thin copper foil with a carrier foil is pressed together with an insulating substrate at a high temperature. The diffusion of copper into the peeling layer may form metallic bonding between the carrier foil and the ultra-thin copper foil, and strong binding strength therebetween may make the peeling off of the carrier foil difficult, and the anti-diffusion layer 120 can suppress this reaction.

In the copper foil with a carrier foil, the peeling layer 130 is a layer for improving peeling properties when the carrier foil is peeled off from the ultra-thin copper foil, and the peeling layer is introduced to peel off the carrier foil cleanly and easily. The peeling layer is removed integrally with the carrier foil.

In the present disclosure, the peeling layer 130 may contain a metal or metal alloy having peeling properties. The peelable metal may include molybdenum or tungsten. The peeling layer 130 may contain a plating catalyst. For example, the peeling layer 130 may contain at least one metal selected from the group consisting of Fe, Co, and Ni.

In addition, the peeling layer may be an organic peeling layer having peeling properties. For example, the peeling layer may contain at least one organic material selected from the group consisting of BTA-based materials.

The ultra-thin copper foil 150 may have a thickness of 12 μm or less. Preferably, the ultra-thin copper foil may have a thickness of 1.5-5 μm.

In the present disclosure, the ultra-thin copper foil preferably has a surface roughness (Rz) of 0.5-1.5 μm.

The ultra-thin copper foil may have a roughened surface and a non-roughened surface according to the use. The roughened surface may be formed through nodulation treatment, and the non-roughened surface may be formed by adding a glossing agent and an inhibitor during the formation of the copper foil.

In the present disclosure, the surface of the ultra-thin copper foil may be additionally subjected to surface treatment. For example, the surface may be treated with any one of heat resistance and chemical resistance treatment, chromate treatment, and silane coupling treatment, or a combination thereof, and the type of surface treatment to be performed may be appropriately selected according to the subsequent process.

The heat resistance and chemical resistance treatment may be, for example, performed by forming a thin film on a metal foil through sputtering, electroplating, or electroless plating of any one or alloy thereof of nickel, tin, zinc, chromium, molybdenum, cobalt, and the like. Considering costs, electroplating is preferable.

For the chromate treatment, an aqueous solution containing hexavalent or trivalent chromium ions may be used. The chromate treatment may be performed by simple immersion treatment, but preferably cathodic treatment. For example, the cathodic treatment is preferably performed under conditions of 0.1 to 70 g/L sodium dichromate, pH 1 to 13, a bath temperature of 15 to 60° C., a current density of 0.1 to 5 A/dm$^2$, an electrolysis time of 0.1 to 100 seconds. In addition, the chromate treatment is preferably performed on anti-rust treatment, whereby moisture resistance and heat resistance can be further improved.

As a silane coupling agent to be used for the silane coupling treatment, at least one material or a mixture selected from the group consisting of epoxy functional silanes, such as 3-glycidoxypropyl trimethoxysilane and 2-(3,4-epoxycyclohexyl)ethyltrimethoxysilane, amino functional silanes, olefin functional silanes, acrylic functional silanes, methacryl functional silanes, mercapto functional silanes, and the like may be used. For example, the silane coupling agent is dissolved in a solvent such as water at a concentration of 0.1 to 15 g/L and applied to a metal foil at room temperature to a temperature of 70° C. or adsorbed on the metal foil by electrodeposition. After the silane coupling treatment, stable bonding can be formed by heating, ultra-violet irradiation, or the like. The heating may be performed at a temperature of 100 to 200° C. for 2 to 60 seconds.

Hereinafter, another embodiment of the present disclosure will be described with reference to FIG. 1B.

An ultra-thin copper foil with a carrier foil shown in FIG. 1B further includes a laser absorption layer 160 between the peeling layer 130 and the heat-resistant layer 140, unlike in the ultra-thin copper foil with a carrier foil shown in FIG. 1A.

The laser absorption layer 160 is composed of a plating layer with low gloss and dark colors. For example, the laser absorption layer 160 may contain Cu and at least one metal or alloy thereof selected from the group consisting of Ni, Co, Fe, Pb, and Sn, and for example, one, two, or three metals, or an alloy thereof.

In the present disclosure, the thickness of the laser absorption layer 160 is preferably 0.01-1 μm. More preferably, the thickness of the laser absorption layer 160 is 0.05-0.5 μm. The absorption layer, when having a thickness of 0.05 μm, has little effect on color change, and the absorption layer, when having a thickness of 1 μm or more, has too dark colors, which may cause a penetration defect in laser processing.

The ultra-thin copper foil with a carrier foil shown in FIG. 1B can exhibit a higher laser absorption rate by addition of the laser absorption layer 160.

MODE FOR INVENTION

Hereinafter, the present disclosure will be described in detail with reference to examples. However, these examples are shown by way of illustration and should not be construed as limiting the present disclosure in any way.

Example 1

A lamination structure was formed in the following order.

A. Carrier Foil

An electrolytic copper foil having a surface roughness (Rz) of 1.2 μm on a glossy surface thereof and a thickness of 18 μm was subjected to pickle treatment by immersion in 100 g/L sulfuric acid for 5 seconds, and then washed with pure water.

B. Surface Treatment Layer

A surface of the carrier foil was activated by pretreatment with the following pretreatment solution.

a. sulfuric acid: 200-300 g/L, hydrogen peroxide: 50-150 g/L, at least one organic agent selected from a nitrogen-containing organic compound and a sulfur-containing organic compound b. temperature: 40° C.

c. pH: 0.01-0.5 d. dipping time: 5 seconds

C. Anti-Diffusion Layer

An anti-diffusion layer was formed by Ni—P plating in a plating bath under the following conditions.

a. Ni concentration: 10-20 g/L, P concentration: 5-15 g/L b. pH 4.0, temperature: 30° C., current density: 1.5 A/dm$^2$, plating time: 2 seconds The plating amount of the formed anti-diffusion layer was a nickel (Ni) plating amount of 301 μg/dm$^2$.

D. Peeling Layer

A peeling layer was formed by Mo—Ni—Fe plating in a plating bath under the following conditions.

a. Mo concentration: 10-30 g/L, Ni concentration: 3-10 g/L, Fe concentration: 1-7 g/L, sodium citrate: 100-200 g/L, and pH 10.2 (30 ml/L ammonia water being added).

b. temperature: 30° C., current density: 10 A/dm$^2$, plating time: 7 seconds

The plating amount of the formed peeling layer was 1.01 mg/dm$^2$, and the composition of the peeling layer was 62.31 wt % of Mo, 30.8 wt % of Ni, and 6.89 wt % of Fe.

E. Heat-Resistant Layer

A heat-resistant layer was formed by Ni—P plating in a plating bath under the following conditions.

a. Ni concentration: 10-20 g/L, P concentration: 5-15 g/L, pH 4.0 b. temperature: 30° C., current density: 1.5 A/dm$^2$, plating time: 2 seconds

The plating amount of the formed heat-resistant layer was a nickel (Ni) plating amount of 301 μg/dm$^2$.

F. Ultra-Thin Copper Foil

A copper foil with a thickness of 2 μm was formed in a plating bath under the following conditions.

a. $CuSO_4$-$5H_2O$: 300 g/L, $H_2SO_4$: 150 g/L, b. temperature: 35° C., current density: 20 A/dm$^2$, plating time: 30 seconds G. Additional Treatments Heat resistance and chemical resistance treatment, chromate treatment, and silane coupling treatment were additionally performed on the surface of the ultra-thin copper foil.

Example 2

An ultra-thin copper foil with a carrier foil was manufactured by the same method as in Example 1 except that a laser absorption layer is added between the peeling layer and the heat-resistant layer. The laser absorption layer was formed in a plating bath under the following conditions.

a. copper concentration: 1-5 g/L, nickel concentration: 1-5 g/L, cobalt concentration: 1-10 g/L, ammonium sulfate: 10-50 g/L, sodium citrate: 30-70 g/L, b. pH 4.5, temperature: 30° C., current density: 20 A/dm$^2$, plating time: 4 seconds

Example 3

An ultra-thin copper foil with a carrier foil was manufactured by the same method as in Example 2 except that an organic peeling layer was formed as a peeling layer. The organic peeling layer was formed in a plating bath under the following conditions.

a. carboxybenzotriazole concentration: 1-5 g/L, copper concentration: 5-15 g/L, H2SO4 concentration: 150 g/L b. temperature: 40° C., dipping time: 30 seconds

Comparative Example 1

An ultra-thin copper foil with a carrier foil was manufactured by the same method as in Example 1 except that the surface treatment layer was omitted.

Comparative Example 2

An ultra-thin copper foil with a carrier foil was manufactured by the same method as in Example 2 except that the surface treatment layer was omitted.

Test Example

The ultra-thin copper foils with a carrier foil, as samples, manufactured in Examples 1 to 3 and Comparative Examples 1 and 2, were measured for surface roughness (Rz). The manufactured samples were subjected to peeling, and the surfaces (S-surfaces) after peeling were measured for gloss and colors. The measurement conditions for surface roughness, gloss, and colors were as follows.

a. Surface Roughness

Measurement equipment: SURFCOM 1400D (TSK, TOKYO SEIMITSU)

Measurement standard: measured according to IPC-TM-650 standard b. Gloss

Measurement equipment: Gloss Metal VG 7000, NIPPON DENSHOKU

Measurement standard: Gs(60°), JIS Z 871-1997 c. Colors

Measurement equipment: CM-2500d, KONIKA MINOLTA

Measurement standard: SCE, L* measurement

The samples, ultra-thin copper foils with a carrier foil manufactured in Examples 1 to 3 and Comparative Examples 1 and 2 were assessed for laser processability. Laser processing conditions were as follows.

d. Laser Processability Evaluation

As for the ultra-thin copper foils, as samples, obtained after the manufactured ultra-thin copper foils with a carrier foil were subjected to peeling, via holes are formed in the copper foils through one-shot processing by a carbon dioxide gas laser via-hole processor using a laser beam for 30-$\mu m$ hole size processing at laser outputs of 7 W and 5 W, and the via hole size was measured. Laser drilling machine LC-4K series by Hitachi was used as laser processing equipment.

Table 1 below summarizes the evaluation results of surface roughness, gloss, colors, and laser processability.

TABLE 1

| Classification | Surface roughness (Rz) | S-surface gloss of ultra-thin foil after peeling | Color L* of ultra-thin foil after peeling | CO2 laser hole size (7 w, 30 μm) | CO2 laser hole size (5 w, 30 μm) |
|---|---|---|---|---|---|
| Example 1 | 1.06 | 13 | 62.1 | 36.03 | 27.11 |
| Example 2 | 1.04 | 10 | 52.6 | 42.24 | 30.19 |
| Example 3 | 1.02 | 9 | 53.9 | 41.91 | 30.81 |
| Comparative Example 1 | 1.00 | 35 | 66.4 | 31.20 | 22.76 |
| Comparative Example 2 | 1.01 | 25 | 64.3 | 34.43 | 26.33 |

As can be shown in Table 1, the S-surface gloss of the ultra-thin foil after peeling was lower and the hole size by CO2 laser was increased in Example 1 having a surface treatment layer formed on the surface of the carrier foil compared with Comparative Example 1 not having a surface treatment layer.

The gloss and colors were more noticeable and the laser hole size was increased in Examples 2 and 3 having both a surface treatment layer and a laser absorption layer compared with Example 1.

Figure 2A:
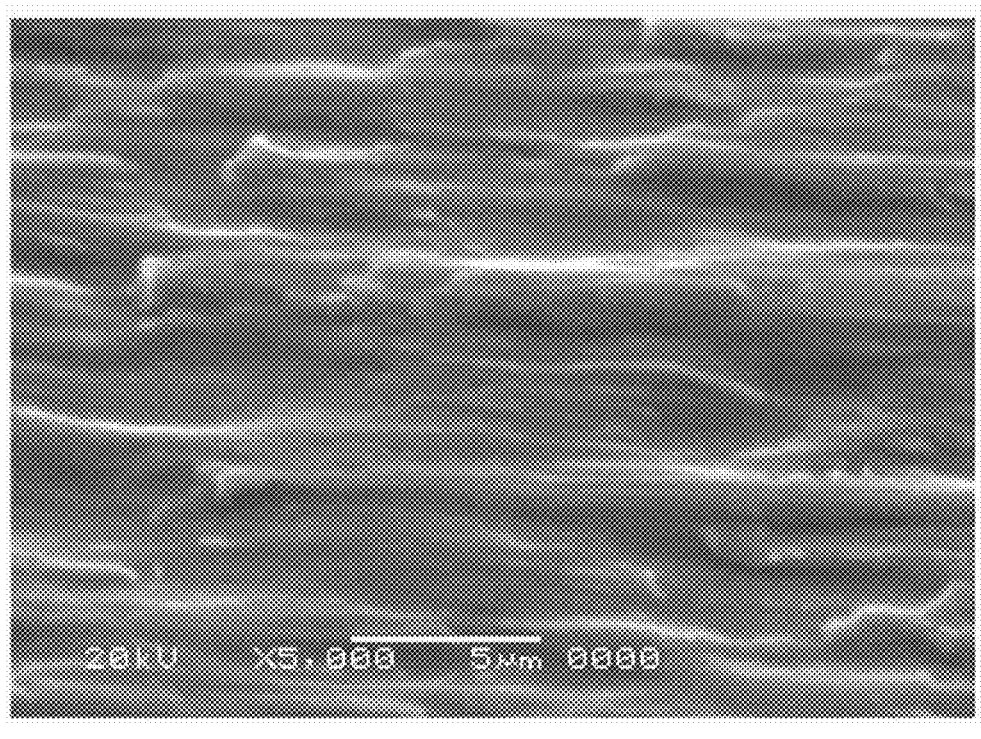
FIGS. 2A and 2B are electron microscopic images obtained by photographing a surface of a carrier foil according to an embodiment of the present disclosure.
Figure 2B:
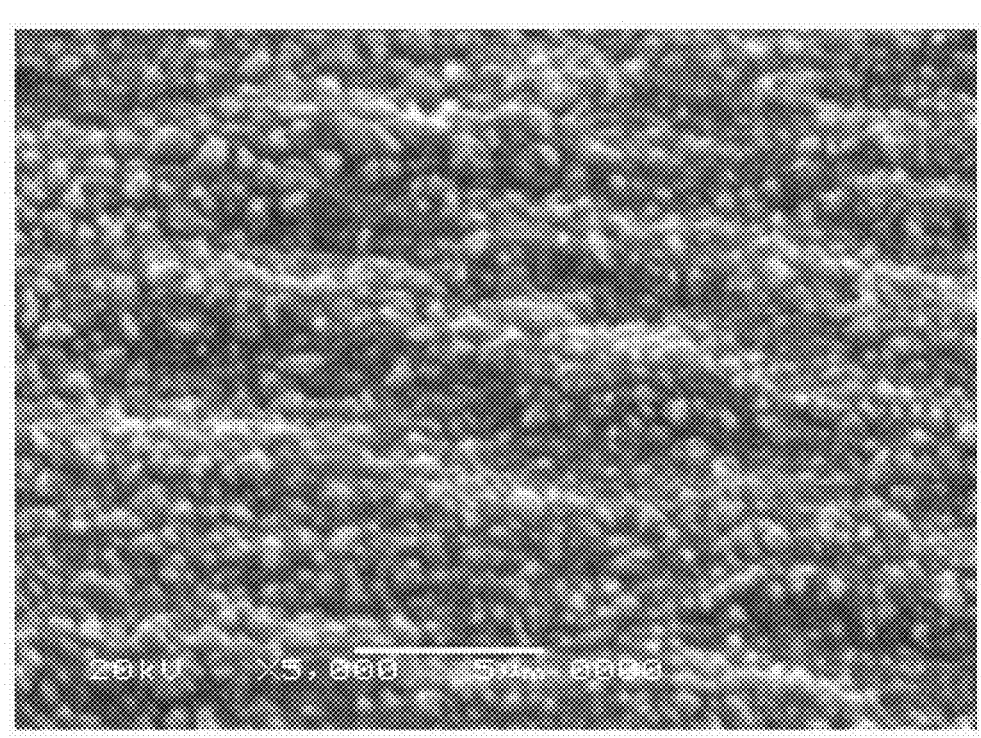

FIGS. 2A and 2B are electron microscopic images obtained by observing the surface of the carrier foil before and after the formation of the surface treatment layer during the manufacturing of Example 1, respectively.

It can be seen from the images that a protrusion structure was developed on the surface by surface treatment.

Figure 3A:
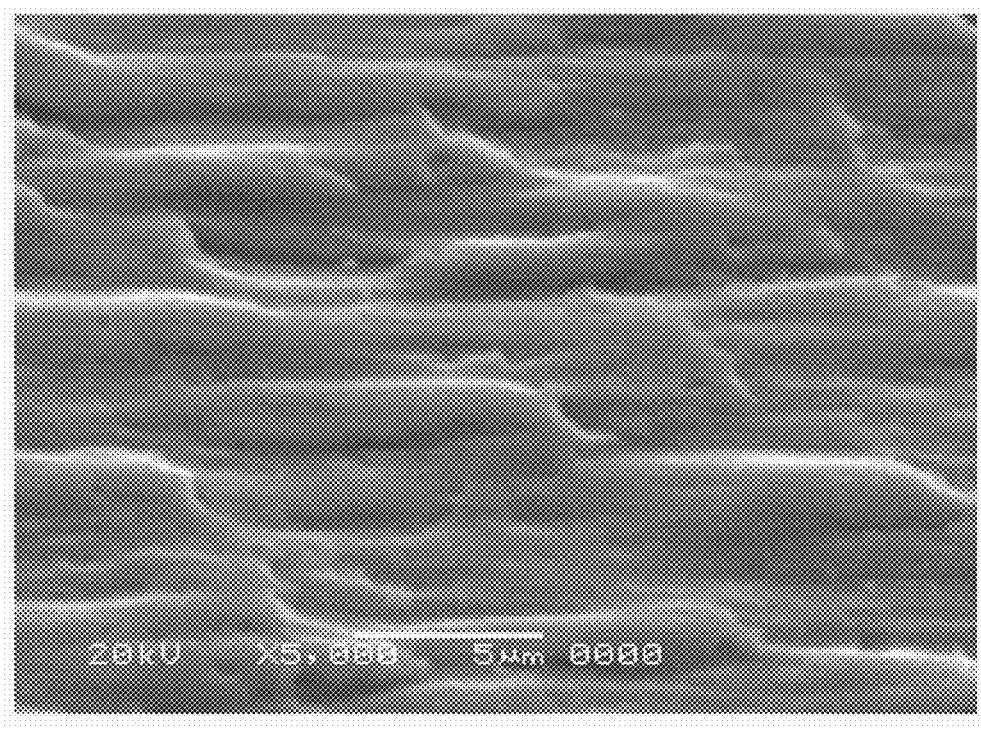
FIGS. 3A and 3B are electron microscopic images obtained by observing surfaces of ultra-thin foils after the peeling off of carrier foils from ultra-thin copper foils with a carrier foil, as samples, manufactured according to an embodiment of the present disclosure.
Figure 3B:
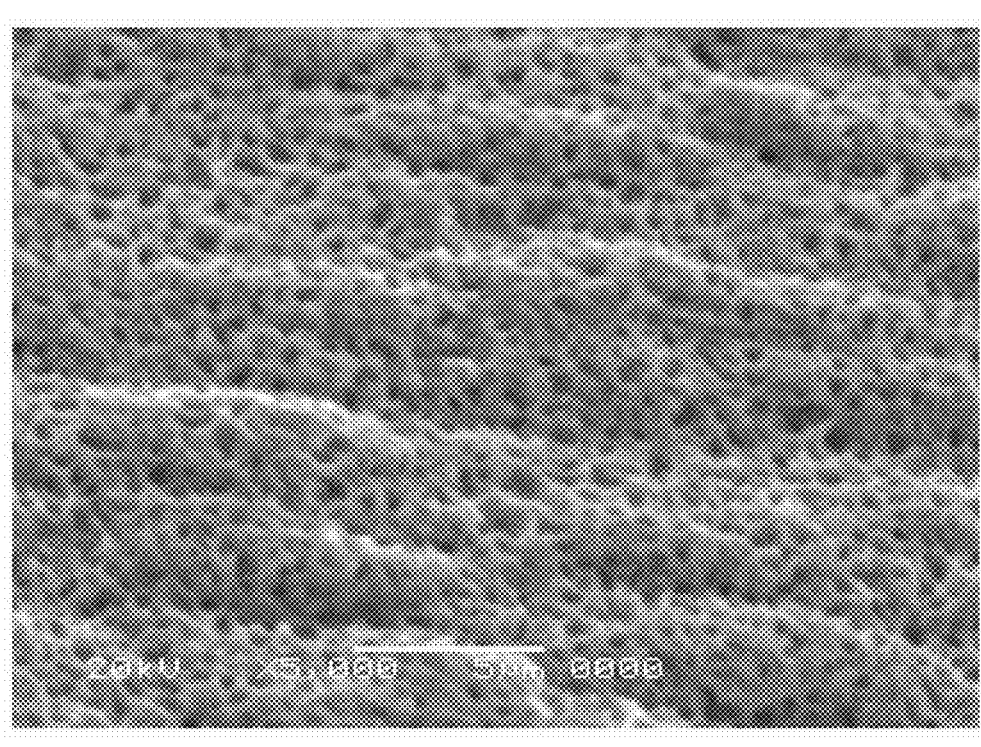

FIGS. 3A and 3B are electron microscopic images obtained by observing the S surfaces of the ultra-thin copper foils after peeling from the samples of Comparative Example 1 and Example 2, respectively.

It can be confirmed from the images that Comparative Example 1 not having a surface treatment layer showed the same condition as the surface of the carrier foil, but Example 2 showed an engraved structure in which a plurality of recessed grooves with an average diameter of 2 $\mu m$ or less were arranged. It can be seen that this structure substantially corresponds to the surface embossed structure in FIG. 2B.

Figure 4A:
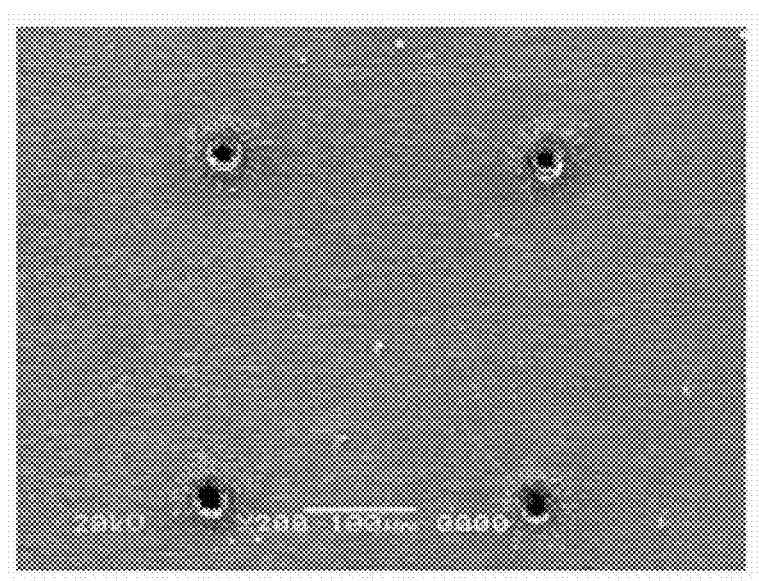
FIGS. 4A, 4B, 5A, and 5B are electron microscopic images obtained by photographing, after laser through-hole processing, ultra-thin copper foils with a carrier foil, as samples, manufactured according to an embodiment of the present disclosure.
Figure 4B:
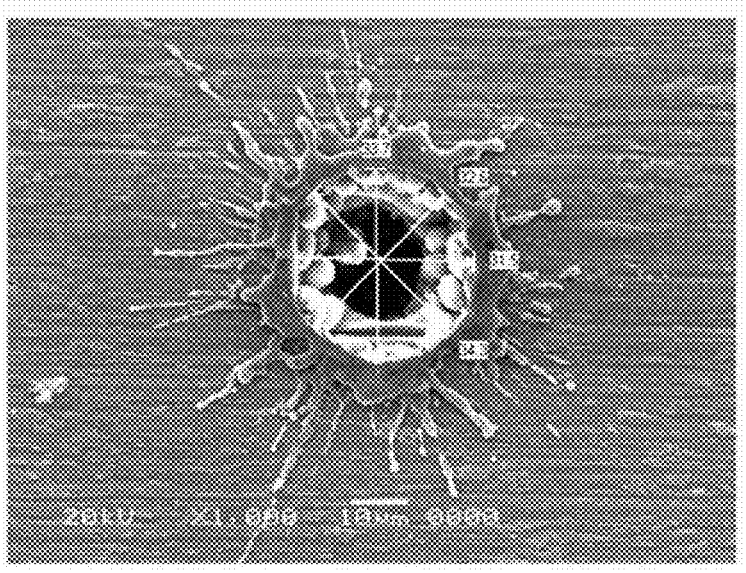
Figure 5A:
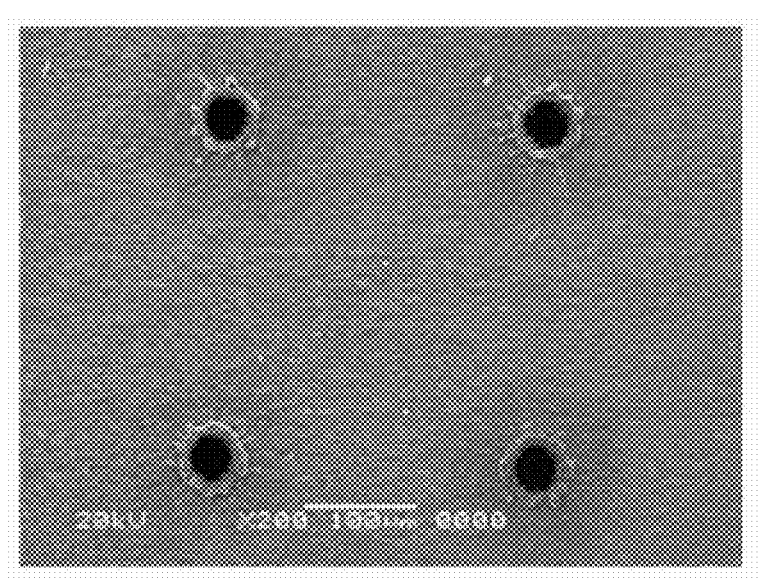
Figure 5B:
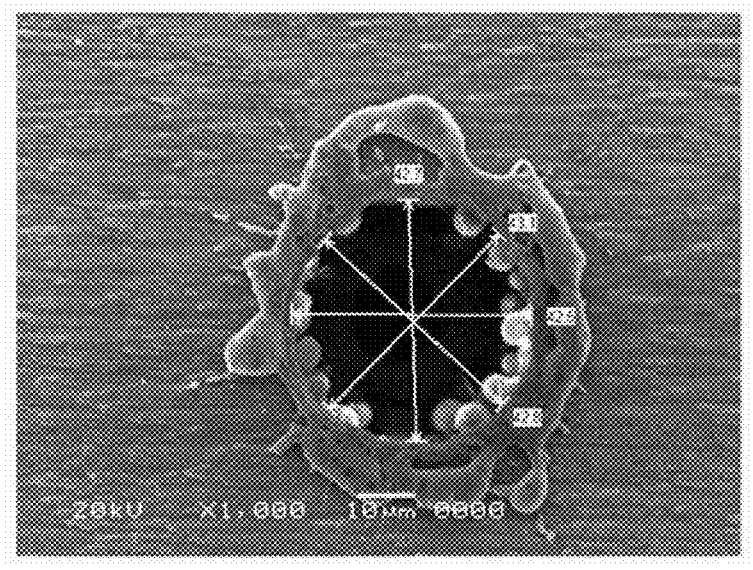

FIGS. 4 and 5 show electron microscopic images obtained by photographing through holes after laser processing of the samples manufactured in Example 2 and Comparative Example 1. As shown, holes with a larger opening diameter were formed at the same laser output in the sample of the example compared with the sample of the comparative example. These results indicate that the ultra-thin copper foils with a carrier foil having a lamination structure of the present disclosure showed via holes or through holes with a larger diameter for a shorter time compared with the conventional art.

Although the present disclosure has been described through a certain embodiment, it shall be appreciated that various permutations and modifications of the described embodiment are possible by those skilled in the art to which the present disclosure pertains without departing from the scope of the present disclosure. Therefore, the scope of the present disclosure shall not be defined by the described embodiment but shall be defined by the appended claims and their equivalents.

What is claimed is:

1. A method for manufacturing an ultra-thin copper foil with a carrier foil by comprising forming a lamination structure of a carrier foil, a peeling layer, and an ultra-thin copper foil, wherein the forming of the lamination structure comprises:

providing the carrier foil;

etching one surface of the carrier foil to form a surface treatment layer; and sequentially forming the peeling layer and the ultra-thin copper foil on the surface treatment layer, wherein the surface treatment layer has a surface structure in which protrusions with an average width of 10 $\mu m$ or less are arranged.

2. The method of claim 1, wherein an etching solution for the etching contains at least one organic agent selected from the group consisting of sulfuric acid, hydrogen peroxide, a nitrogen-containing organic compound, and a sulfur-containing organic compound.

3. The method of claim 1, wherein the surface treatment layer has a surface structure in which protrusions with an average width of 2 $\mu m$ or less are arranged.

4. The method of claim 1, wherein the protrusions have an area density of 8,000-10,000/mm$^2$.

5. The method of claim 1, wherein the protrusions are formed by etching a surface of the carrier foil.

6. A method for manufacturing an ultra-thin copper foil comprising:

forming a lamination structure of a carrier foil, a peeling layer, and an ultra-thin copper foil; and peeling the ultra-thin copper foil from the lamination structure, wherein the forming of the lamination structure comprises:

providing the carrier foil;

etching one surface of the carrier foil to form a surface treatment layer; and sequentially forming the peeling layer and the ultra-thin copper foil on the surface treatment layer, wherein a surface structure of the peeled ultra-thin copper foil has grooves with an average width of 10 $\mu$m or less.

7. The method of claim 6, wherein a surface structure of the peeled ultra-thin copper foil grooves with an average width of 2 $\mu$m or less.

8. The method of claim 6, wherein the grooves have an area density of 8,000-10,000/mm$^2$.

\* \* \* \* \*